(12) United States Patent
Shang et al.

(10) Patent No.: US 12,254,939 B2
(45) Date of Patent: Mar. 18, 2025

(54) MEMORY STRUCTURE AND MEMORY DEVICE

(71) Applicant: ChangXin Memory Technologies, Inc., Hefei (CN)

(72) Inventors: Weibing Shang, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/908,477

(22) PCT Filed: May 12, 2022

(86) PCT No.: PCT/CN2022/092551
§ 371 (c)(1),
(2) Date: Aug. 31, 2022

(87) PCT Pub. No.: WO2023/071144
PCT Pub. Date: May 4, 2023

(65) Prior Publication Data
US 2024/0194286 A1   Jun. 13, 2024

(30) Foreign Application Priority Data

Oct. 29, 2021  (CN) .......................... 202111270751.1

(51) Int. Cl.
G11C 7/00 (2006.01)
G11C 29/44 (2006.01)
(52) U.S. Cl.
CPC .................... *G11C 29/44* (2013.01)
(58) Field of Classification Search
CPC .................................................... G11C 29/44
(Continued)

(56) References Cited

U.S. PATENT DOCUMENTS 5,255,234 A   10/1993   Seok
5,761,138 A    6/1998   Lee et al.
(Continued)

FOREIGN PATENT DOCUMENTS

CN   102332298 A    1/2012
CN   101425343 B   12/2012
(Continued)

OTHER PUBLICATIONS

PCT/CN2022/092551 International Search Report mailed Aug. 10, 2022.
(Continued)

*Primary Examiner* — Viet Q Nguyen
(74) *Attorney, Agent, or Firm* — Kilpatrick Townsend & Stockton LLP

(57) ABSTRACT

A memory structure of an integrated circuit includes a plurality of memory arrays arranged in parallel along the first direction and extending along the second direction, a sensitivity amplifier array extending along the second direction is arranged between every two memory arrays, and the sensitivity amplifier array includes an odd-numbered sensitivity amplifier array and an even-numbered sensitivity amplifier array, the odd-numbered sensitivity amplifier array is connected to an odd-numbered global signal line, and the even-numbered sensitivity amplifier array is connected to the even-numbered global signal line; a first sensitivity amplifier array is arranged between the memory arrays at the edge, and the first sensitivity amplifier array is connected to both the odd-numbered global signal line and the even-numbered global signal line. The present disclosure can improve reliability, yield and test success rate of the memory products.

14 Claims, 10 Drawing Sheets

(58) Field of Classification Search
USPC .......................................................... 365/200
See application file for complete search history.

(56) References Cited

U.S. PATENT DOCUMENTS

| | | | | |
|---|---|---|---|---|
| 6,084,816 A * | 7/2000 | Okamura | ................ | G11C 7/18 365/207 |
| 6,144,577 A * | 11/2000 | Hidaka | ................ | G11C 29/848 365/230.03 |
| 6,813,199 B2 * | 11/2004 | Hidaka | ................ | G11C 29/846 365/189.11 |
| 6,898,110 B2 * | 5/2005 | Ishimatsu | ............. | H01L 23/528 257/E23.151 |
| 7,123,538 B2 * | 10/2006 | Yamauchi | .............. | G11C 16/26 365/233.17 |
| 7,136,314 B2 * | 11/2006 | You | ........................ | G11C 29/14 365/201 |
| 7,142,471 B2 * | 11/2006 | Fasoli | ................... | G11C 29/816 365/230.01 |
| 7,149,136 B2 * | 12/2006 | Tanishima | ............. | G11C 29/24 365/201 |
| 7,352,645 B2 * | 4/2008 | Sforzin | ................... | G11C 7/18 365/204 |
| 7,460,386 B2 * | 12/2008 | Cho | ........................ | G11C 5/025 365/163 |
| 7,603,592 B2 * | 10/2009 | Sekiguchi | ........... | G06F 11/1044 714/763 |
| 7,609,569 B2 * | 10/2009 | Fragano | ............... | G11C 29/844 365/230.01 |
| 7,633,818 B2 * | 12/2009 | Tomita | ................... | G11C 29/02 365/207 |
| 7,672,173 B2 * | 3/2010 | Ooishi | ................... | G11C 16/32 365/230.02 |
| 7,961,541 B2 * | 6/2011 | Chan-Choi | ........... | G11C 11/406 365/233.5 |
| 8,385,111 B2 * | 2/2013 | Kim | ........................ | G11C 7/18 365/163 |
| 8,488,358 B2 * | 7/2013 | Hirose | ..................... | G11C 7/18 365/72 |
| 8,493,807 B2 * | 7/2013 | Narui | .................. | G11C 11/4091 365/210.1 |
| 8,908,454 B2 * | 12/2014 | Vogelsang | ............... | G11C 8/14 365/230.02 |
| 9,672,922 B2 * | 6/2017 | Yano | ..................... | G11C 16/26 |
| 9,953,725 B2 * | 4/2018 | Ryu | ........................ | G11C 29/52 |
| 11,508,456 B2 * | 11/2022 | Ryu | ..................... | G11C 11/4096 |
| 2004/0037112 A1 | 2/2004 | Ooishi | | |
| 2010/0124135 A1 * | 5/2010 | Kim | ..................... | G11C 11/4097 365/205 |
| 2012/0230139 A1 * | 9/2012 | Son | ..................... | G11C 11/4091 365/207 |
| 2013/0301330 A1 * | 11/2013 | Matsumoto | ......... | G11C 11/4094 365/72 |
| 2020/0365191 A1 * | 11/2020 | Won | ........................ | G11C 7/08 |

FOREIGN PATENT DOCUMENTS

| | | |
|---|---|---|
| CN | 103177751 A | 6/2013 |
| CN | 103377686 A | 10/2013 |
| CN | 103632729 A | 3/2014 |
| CN | 108766493 A | 11/2018 |
| CN | 110070904 A | 7/2019 |
| CN | 212032139 U | 11/2020 |

OTHER PUBLICATIONS

European Patent Office, Extended European Search Report Issued in Application No. 22885057.4, Dec. 20, 2024, Germany, 9 pages.

* cited by examiner

MEMORY STRUCTURE AND MEMORY DEVICE

CROSS REFERENCES TO RELATED APPLICATIONS

This present application claims the benefit of priority to Chinese Patent Application No. 202111270751.1, filed on Oct. 29, 2021, entitled "Memory Structure and Memory Device", the contents of which are incorporated herein by reference in its entirety.

TECHNICAL FIELD

The present disclosure relates to the technical field of integrated circuit manufacturing, and in particular, to a memory with higher reliability.

BACKGROUND

As integrated circuit manufacturing process dimensions continue to shrink, especially when new processes are developed at an early stage, the yield improvement of memory products faces great challenges. How to effectively improve the yield of memory products and the repair success rate for the reliability of memory chips has become an important area in the field of memory manufacturing.

It should be noted that the information disclosed in the above background section is only for enhancement of understanding of the background of the present disclosure, and therefore should not form the prior art.

SUMMARY

The present disclosure provides a memory structure and a memory improving yield, reliability, and repair success rate of the memory.

According to a first aspect of the present disclosure, a memory structure is provided, comprising a plurality of memory arrays arranged in parallel along a first direction and a sensitivity amplifier array extending along the second direction arranged between every two memory arrays, wherein the sensitivity amplifier array includes an odd-numbered sensitivity amplifier array and an even-numbered sensitivity amplifier array, the odd-numbered sensitivity amplifier array and the even-numbered sensitivity amplifier array are alternating along a first direction, the odd-numbered sensitivity amplifier arrays connect to the odd-numbered global signal lines, and the even-numbered sensitivity amplifier arrays connect to the even-numbered global signal lines; a spare memory array, arranged on one side of the memory arrays at the edge in the first direction, wherein a first sensitivity amplifier array is disposed between the spare memory array and the memory arrays at the edge, and wherein the first sensitivity amplifier array is connected to both the odd-numbered global signal lines and the even-numbered global signal lines.

According to a second aspect of the present disclosure, a memory device is provided including the memory structures described above.

According to the present disclosure, by arranging a spare memory array and a first sensitivity amplifier array located at the edge of the memory array and connecting the first sensitivity amplifier array to both the odd-numbered global signal lines and the even-numbered global signal lines simultaneously, when damage occurs on the memory array or the sensitivity amplifier array, the first sensitivity amplifier array and the spare memory array can automatically be used for replacement, thereby improving the reliability of the memory product and the success rate of the factory test, improving the yield of the product, and reducing the production cost and use cost of memory products.

It is to be understood that both the foregoing general description and the following detailed description are exemplary and explanatory only and are not limiting of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those of ordinary skill in the art, other drawings can also be obtained from these drawings without any creative effort.

DETAILED DESCRIPTION OF THE PREFERRED EMBODIMENTS

Figure 1:
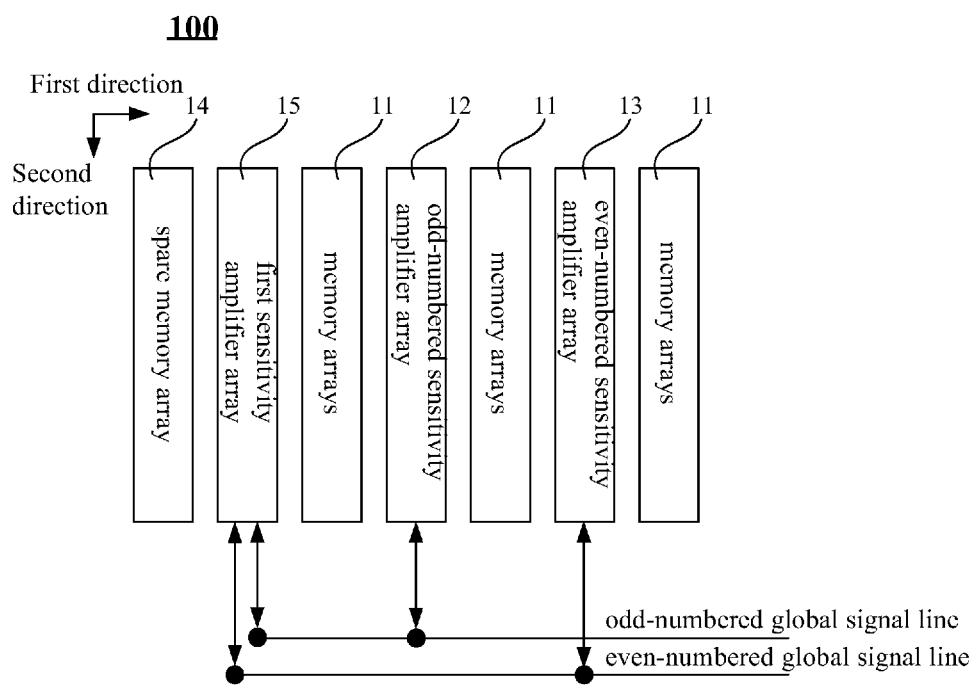
FIG. 1 is a schematic diagram of a memory structure in an exemplary embodiment of the present disclosure.

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

The present disclosure effectively overcomes various disadvantages in the prior arts and hence has high industrial usage value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The drawings are only schematic illustrations of the present disclosure and are not necessarily drawn to scale. The same reference numerals in the figures denote the same or similar parts, and thus their repeated description will be omitted.

Furthermore, the described features, structures or characteristics can be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known structures, methods, devices, implementations, or operations are not shown or described in detail to avoid overwhelming attention and obscure all aspects of the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features.

Example embodiments will now be described more fully with reference to the accompanying drawings. Example embodiments, however, can be embodied in various forms and should not be construed as limited to the examples set forth herein; rather, these embodiments are provided so that this disclosure will be thorough and complete, and will fully convey the concept of example embodiments to those skilled in the art. The described features, structures, or characteristics may be combined in any suitable manner in one or more embodiments. In the following description, numerous specific details are provided in order to give a thorough understanding of the embodiments of the present disclosure. However, those skilled in the art will appreciate that the technical solutions of the present disclosure may be practiced without one or more of the specific details, or other methods, components, devices, steps, etc. may be employed. In other instances, well-known solutions have not been shown or described in detail to avoid obscuring aspects of the present disclosure.

In addition, the drawings are merely schematic illustrations of the present disclosure, and the same reference numerals in the drawings denote the same or similar parts, and thus their repeated descriptions will be omitted. Some of the block diagrams shown in the figures are functional entities, which do not necessarily correspond to physically or logically separate entities. These functional entities may be implemented in software, or in one or more hardware modules or integrated circuits, or in different networks and/or processor devices and/or microcontroller devices.

The exemplary embodiments of the present disclosure will be described in detail below with reference to the accompanying drawings.

FIG. 1 is a schematic structural diagram of a memory structure according to an exemplary embodiment of the present disclosure.

Referring to FIG. 1, the memory structure 100 may include:

a plurality of memory arrays 11 arranged in parallel along the first direction and extending along the second direction, a sensitivity amplifier array extending along the second direction is arranged between every two memory arrays 11, and the sensitivity amplifier array includes an odd-numbered sensitivity amplifier array 12 and the even-numbered sensitivity amplifier array 13, the odd-numbered sensitivity amplifier array 12 and the even-numbered sensitivity amplifier array 13 are staggered along the first direction, the odd-numbered sensitivity amplifier array 12 is connected to the odd-numbered global signal line, and the even-numbered sensitivity amplifier array 13 is connected to the even-numbered global signal line. It can be known that the aforementioned first direction is the direction in which the bit lines extend, and the aforementioned second direction is the direction in which the word lines extend. The memory array 11 shown in FIG. 1 may be one rank (row), for example.

The spare memory array 14 is arranged on one side of the memory array 11 located at the edge in the first direction. A first sensitivity amplifier array 15 is arranged between the spare memory array 14 and the memory array 11 located at the edge. Both odd-numbered global signal lines and even-numbered global signal line are connected. Since the odd-numbered global signal lines and the even-numbered global signal line are simultaneously connected, the first sensitivity amplifier array 15 can simultaneously control the spare memory array 14 and the memory array 11 located at the edge. When it is detected that any memory array 11 is faulty, the first sensitivity amplifier array 15 can be controlled to read and write to the spare memory array 14, so as to realize the replacement of the faulty memory array. When any odd-numbered sensitivity amplifier array 12 or even-numbered sensitivity amplifier array 13 is detected to be faulty, the first sensitivity amplifier array 15 can be used to replace the faulty sensitivity amplifier array.

Since the sensitivity amplifier array reads and writes half of the memory array, in one embodiment, two spare memory arrays 14 and two first sensitivity amplifier arrays 14 can be used to implement replacement of a failed memory array or a failed sensitivity amplifier array.

Figure 2:
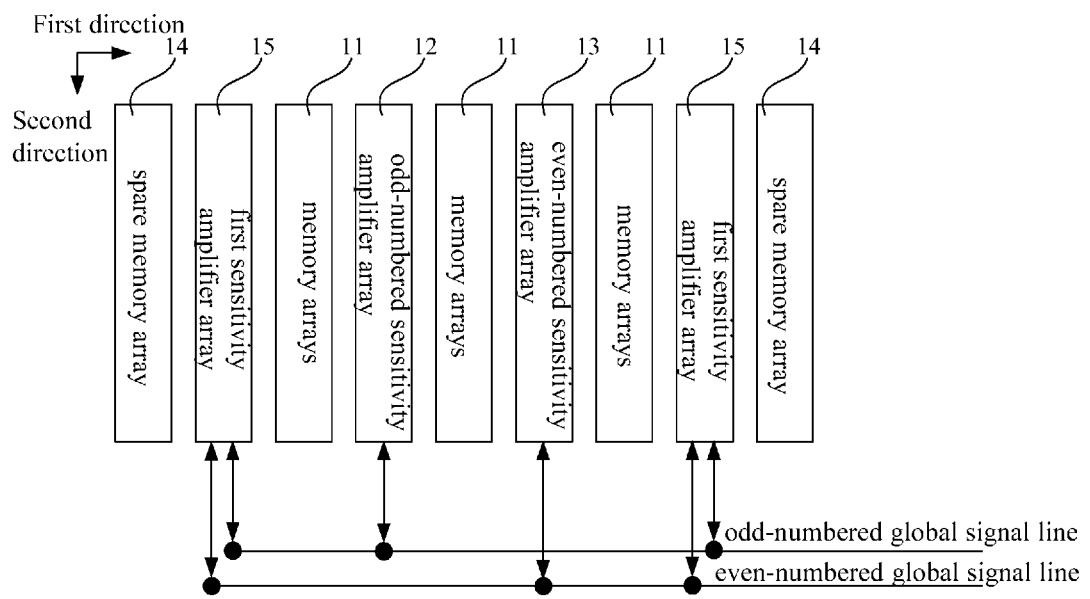
FIG. 2 is a schematic diagram of a memory structure in an embodiment of the present disclosure.

FIG. 2 is a schematic structural diagram of a memory structure in an embodiment of the present disclosure.

Referring to FIG. 2, in one embodiment, the number of spare memory arrays 14 is two, which are respectively disposed beside the two memory arrays 11 located at the edge. Correspondingly, the number of the first sensitivity amplifier arrays 15 is also two. Referring to the embodiment shown in FIG. 2, the number of the spare memory arrays 14 is the same as the number of the first sensitivity amplifier arrays 15. When those skilled in the art set up more spare memory arrays 14, the first sensitivity amplifier arrays 15 can be connected according to the above rules. It can be understood that when more than two spare memory arrays 14 are provided, other spare memory arrays 14 may be provided beside the spare memory arrays 14 shown in FIG. 2. Same as FIG. 1, the first sensitivity amplifier array 15 can be arranged either on the right side of the spare memory array 14 or on the left side of the spare memory array 14, that is, the relative position of the first sensitivity amplifier array 15 and the spare memory array 14. It can be interchanged, and the present disclosure does not make any special limitation to this.

In practical applications, the structure shown in FIG. 1 or FIG. 2 can realize the replacement of the faulty memory array when the memory array fails.

It can be determined that the memory array is faulty according to the detection result of the memory array detection circuit. For example, when a memory product is detected, the faulty memory array can be determined according to the memory array failure message generated by the detection; or, during the use of the memory product, it can be triggered in various ways (for example, timing or each power-on startup, etc.) to detect memory arrays to determine memory array failures.

Since a memory array usually has multiple memory sub-arrays (blocks), and each memory sub-array usually has multiple memory cells (cells), it can be determined how many memory cells or how many memory sub-arrays according to the general settings of the product, when there is a failure (e.g. 30% failure), the memory array is determined to be faulty. The embodiment of the present disclosure does not limit the specific trigger logic for judging the memory failure.

There can be one or more failed memory arrays. When the number of the failed memory arrays is less than half the number of the spare memory arrays, the spare memory arrays can be used to replace the failed memory arrays. When the number of failed memory arrays is more than or equal to one-half the number of spare memory arrays, the location of the failed memory array can be critical (e.g., middle or edge) or damaged (e.g., what percentage of memory cells or memory sub-array failure), determine which failed memory arrays to replace with spare memory arrays.

In order to further illustrate the replacement functions of the spare memory array 14 and the first sensitivity amplifier array 15 in the present disclosure, the connection relationship of the data lines in the exemplary embodiment of the present disclosure is described below with reference to FIG. 3 and FIG. 4.

Figure 3:
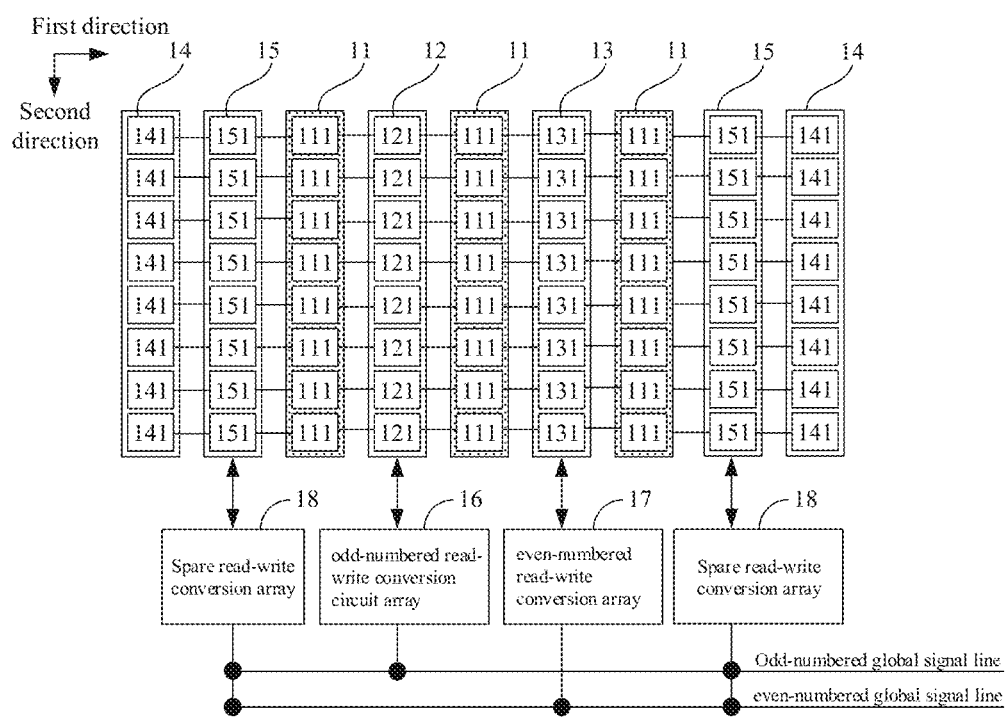
FIG. 3 is a schematic structural diagram of a memory structure in an embodiment of the present disclosure.

FIG. 3 is a schematic structural diagram of a memory structure in an embodiment of the present disclosure.

Referring to FIG. 3, in one embodiment, each memory array 11 includes a plurality of memory sub-arrays 111 arranged along the second direction, the odd-numbered sensitivity amplifier array 12 includes a plurality of odd-numbered sensitivity amplifier sub-arrays 121, and the even-numbered sensitive amplifier sub-arrays 131. The even-numbered sensitivity amplifier array 13 includes a plurality of even-numbered sensitivity amplifier sub-arrays 131, and the odd-numbered sensitivity amplifier sub-arrays 121 or the even-numbered sensitivity amplifier sub-arrays 131 correspond to the memory sub-array 111.

Each odd-numbered sensitivity amplifier sub-arrays 121 is electrically connected to a plurality of odd-numbered global signal lines through an odd-numbered read-write conversion circuit, and all odd-numbered read-write conversion circuits corresponding to an odd-numbered sensitivity amplifier array 12 constitute an odd-numbered read-write conversion circuit array 16; each even-numbered sensitivity amplifier sub-arrays 131 are electrically connected to a plurality of even-numbered global signal line through an even-numbered read-write conversion circuit, and all even-numbered read-write conversion circuits corresponding to one even-numbered sensitivity amplifier array 13 constitute an even-numbered read-write conversion array 17.

The spare memory array 14 includes a plurality of first spare memory sub-arrays 141, the first sensitivity amplifier array 15 includes a plurality of first sensitivity amplifier sub-arrays 151, and each first spare memory sub-array 141 corresponds to a first sensitivity amplifier sub-array 151. Each first sensitivity amplifier sub-array 151 is electrically connected to both the odd-numbered global signal line and the even-numbered global signal line through a spare read-write conversion circuit, and the spare read-write conversion circuit corresponding to the first sensitivity amplifier array 15 forms a spare read-write conversion array 18. It can be understood that the odd-numbered read-write conversion array 16 is connected to the odd-numbered read control signal line and the odd-numbered write control signal line, and the even-numbered read-write conversion array 17 is connected to the even-numbered read control signal line and the even-numbered write control signal line. The spare read-write conversion array 18 is simultaneously connected to odd-numbered read control signal lines, odd-numbered write control signal lines, even-numbered read control signal lines, and even-numbered write control signal lines, each of which is not shown in the figure.

Figure 4:
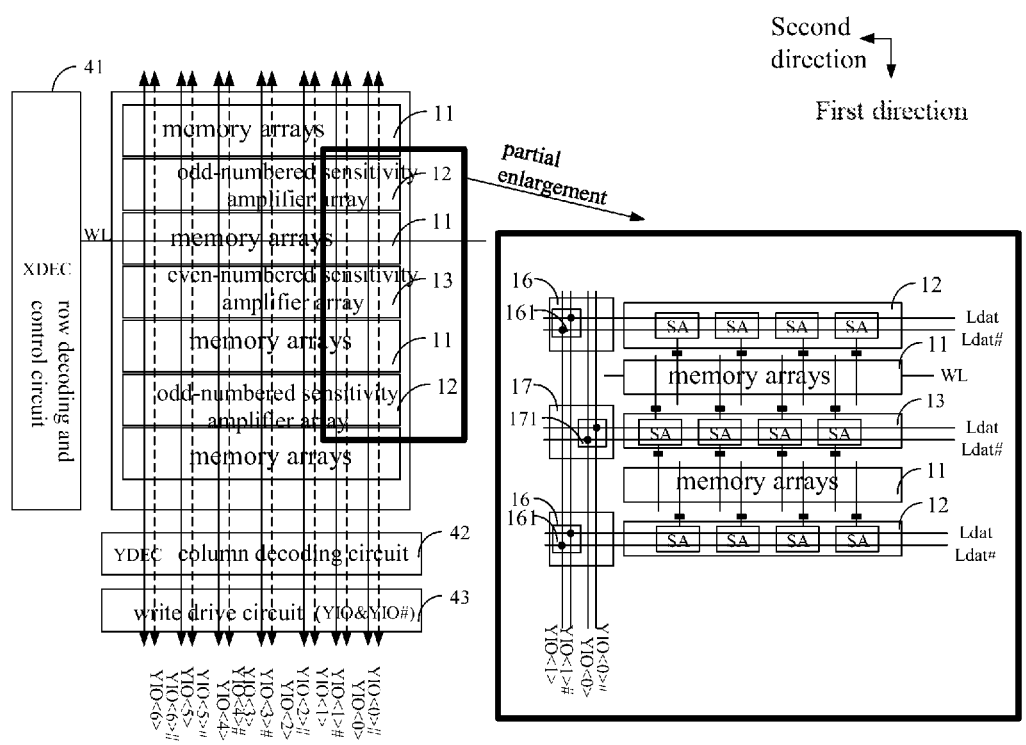
FIG. 4 is a schematic diagram of a memory array control circuit.

FIG. 4 is a schematic diagram of a memory array control circuit.

In FIG. 4, the memory array control circuit mainly includes a row decoding and control circuit 41 (XDEC, X Decoder), a column decoding circuit 42 (YDEC, Y Decoder), a read amplifier circuit and a write drive circuit 43. The column decoding circuit 42 is used for providing a column selection signal (CSL, Column Select). The read amplifier circuit and the write drive circuit 43 include a second sensitivity amplifier (SSA) and a write driver (write driver). Both the read amplifier circuit and the write driver circuit are connected to the global signal line YIO and the complementary global signal line YIO #. The global signal line YIO and the complementary global signal line YIO # appear in pairs, and a pair of global signal lines YIO and the complementary global signal line YIO # constitute a group of signals corresponding to the odd-numbered global signal lines shown in FIG. 1, FIG. 2 or FIG. 3 line or a group of signal lines corresponding to the even-numbered global signal lines. For the relationship between the global signal lines and the memory array 11, the odd-numbered sensitivity amplifier array 12, the even-numbered sensitivity amplifier array 13, the odd-numbered read-write conversion circuit array 16 and the even-numbered read-write conversion circuit array 17, please refer to the partial enlargement on the right side of FIG. 4.

When a WL (Word Line) is selected by the XDEC line decoder and control circuit 41, the data of the corresponding memory array 11 is transmitted to the odd-numbered sensitivity amplifier array 12 and the even-numbered sensitive amplifier array 12 located on both sides of the memory array. The amplifier array 13 is amplified by the odd-numbered sensitivity amplifier array 12 and the even-numbered sensitivity amplifier array 13, and then written back to the memory cells connected to the selected WL. When the data needs to be changed or rewritten, the column decoding circuit 42 selects the corresponding sensitivity amplifier, and the data is transmitted from a set of YIO&YIO # global signal lines to a set of Ldat&Ldat # local signal lines through a read-write conversion circuit (lrwap), Write to the sensitivity amplifier and the connected memory unit corresponding to the read-write conversion circuit. When data is read out, the direction of data transmission is reversed. The YDEC column decoding circuit 42 selects the corresponding sensitivity amplifier, and the data is transmitted to a group of Ldat&Ldat # local signal lines, and then transmitted by the read-write conversion circuit (lrwap) connected to the sensitivity amplifier to a group of YIO&YIO # global signal lines, and finally amplified and output by the SSA in the read amplifying circuit and the write drive circuit 43. When working, YIO&YIO # is a dual-phase paired mode, and the read or write modes are in opposite complementary polarities.

It can be seen that each odd-numbered read-write conversion circuit 161 in FIG. 4 is connected to odd-numbered global signal lines (eg YIOn+1, YIOn+3), complementary odd-numbered global signal lines (YIOn+1 #, YIOn+3 #) And a group of Ldat&Ldat # signal lines, a plurality of odd-numbered read-write conversion circuits 161 constitute an odd-numbered read-write conversion circuit array 16; each even-numbered read-write conversion circuit 171 connects to a complementary even-numbered global signal line (YIOn #, YIOn+2 #), a group of Ldat&Ldat # signal lines, and a plurality of even-numbered read-write conversion circuits 171 constitute an even-numbered read-write conversion circuit array 17. The above n is an even number greater than or equal to zero. In some embodiments, the odd-numbered read-write conversion circuit 161 may not be connected to the complementary odd-numbered global signal line, that is, if the complementary odd-numbered global signal line is not provided. Similarly, the even-numbered read-write conversion circuit 171 may also not be connected to the complementary even-numbered signal line. The odd numbered global signal line, that is, the complementary even numbered global signal line is not provided, which is not specifically limited in the present disclosure.

From the perspective of the memory unit, the odd-numbered sensitivity amplifier array 12 or the even-numbered sensitivity amplifier array 13 includes multiple sensitivity amplifier sub-arrays, and each sensitivity amplifier sub-array controls half of the memory arrays 11 on the left and right sides. The lines of the array are bit lines (BL, Bit Line). It can be known from FIG. 4 in combination with FIG. 3 that half of the memory cells in the spare memory array 14 are controlled by the first sensitivity amplifier array 15 connected to the spare memory array 14. Replacing a complete memory array 11 can be achieved by using the two first sensitivity amplifier arrays 15 to control the two spare memory arrays 14 respectively.

Specifically, when a memory array 11 fails, control a first sensitivity amplifier array 15 to perform data exchange with the odd-numbered global signal lines connected to the odd-numbered sensitivity amplifier array corresponding to the faulty memory array, so as to use a spare memory array 14 Realize the replacement of the memory cells of half of the faulty memory arrays; control another first sensitivity amplifier array 15 to perform data exchange with the even-numbered global signal lines connected to the even-numbered sensitivity amplifier arrays corresponding to the faulty memory array, so as to use another spare memory array 14 enables replacement of the memory cells of the other half of the failed memory array.

In addition, the embodiment of the present disclosure can also use the first sensitivity amplifier array 15 and the spare memory array 14 to replace the two memory arrays 11 affected by the faulty sensitivity amplifier array when the sensitivity amplifier array is damaged.

When a sensitivity amplifier array (whether it is an odd-numbered sensitivity amplifier array 12 or an even-numbered sensitivity amplifier array 13) is damaged, half of the memory cells in the two memory arrays 11 it controls are affected. Therefore, when it is determined that the sensitivity amplifier array is faulty, one spare memory array 14 can be used to replace half of the memory cells in the memory array 11 that cannot function properly due to the faulty sensitivity amplifier, and another spare memory array 14 can be used to replace half of the memory cells that are affected by the faulty sensitivity amplifier. The other half of the memory cells in the memory array 11 in normal operation.

During specific implementation, if a certain whole sensitivity amplifier array is faulty, for example, the odd-numbered sensitivity amplifier array 12 fails, the sensitivity amplifier s in the array exchange data with the odd-numbered global signal lines, so when replacing them, Half of the two first sensitivity amplifier arrays 15 corresponding to the two spare memory arrays 14 connected to the spare memory array 14 are used as odd-numbered sensitivity amplifier arrays, and carry out data with the odd-numbered global signal lines corresponding to the faulty odd-numbered sensitivity amplifier arrays 12 exchange. Only when it is judged that data exchange with an affected memory array 11 is required through the faulty sensitivity amplifier array, the word line WL is set to select the memory array 11 and a corresponding spare memory array 14, and control the connection of the spare memory array 14. The first sensitivity amplifier array 15 and the odd-numbered global signal line connected to the faulty sensitivity amplifier realize data exchange (the memory array 11 connected to the first sensitivity amplifier 15 is not selected at this time); when exchanging data with another affected memory array 11, set the word line WL to select the memory array 11 and its corresponding other spare memory array 14, and control the first sensitivity amplifier array 15 connected to the spare memory array 14 to be connected with the fault. The odd-numbered global signal lines connected to the sensitivity amplifier s realize data exchange. The connection between the spare memory array 14 and the word line WL is the same as the connection between the memory array 11 and the word line WL.

In the same way, if the even-numbered sensitivity amplifier array 13 fails and is used for replacement, the half of the connection between the two first sensitivity amplifier arrays 15 corresponding to the two spare memory array 14, and the spare memory array 14 also needs to be used as an even-numbered sensitivity amplifier array, and perform data exchange with the even-numbered global signal line corresponding to the faulty even-numbered sensitivity amplifier array 13.

As can be seen from the above description, the first sensitivity amplifier array 15 must support both the functions of being an odd-numbered sensitivity amplifier array and an even-numbered sensitivity amplifier array. Therefore, the control mode of each sensitivity amplifier in the first sensitivity amplifier array 15 needs to be modified, that is, the spare read-write conversion circuit needs to be modified.

Figure 5:
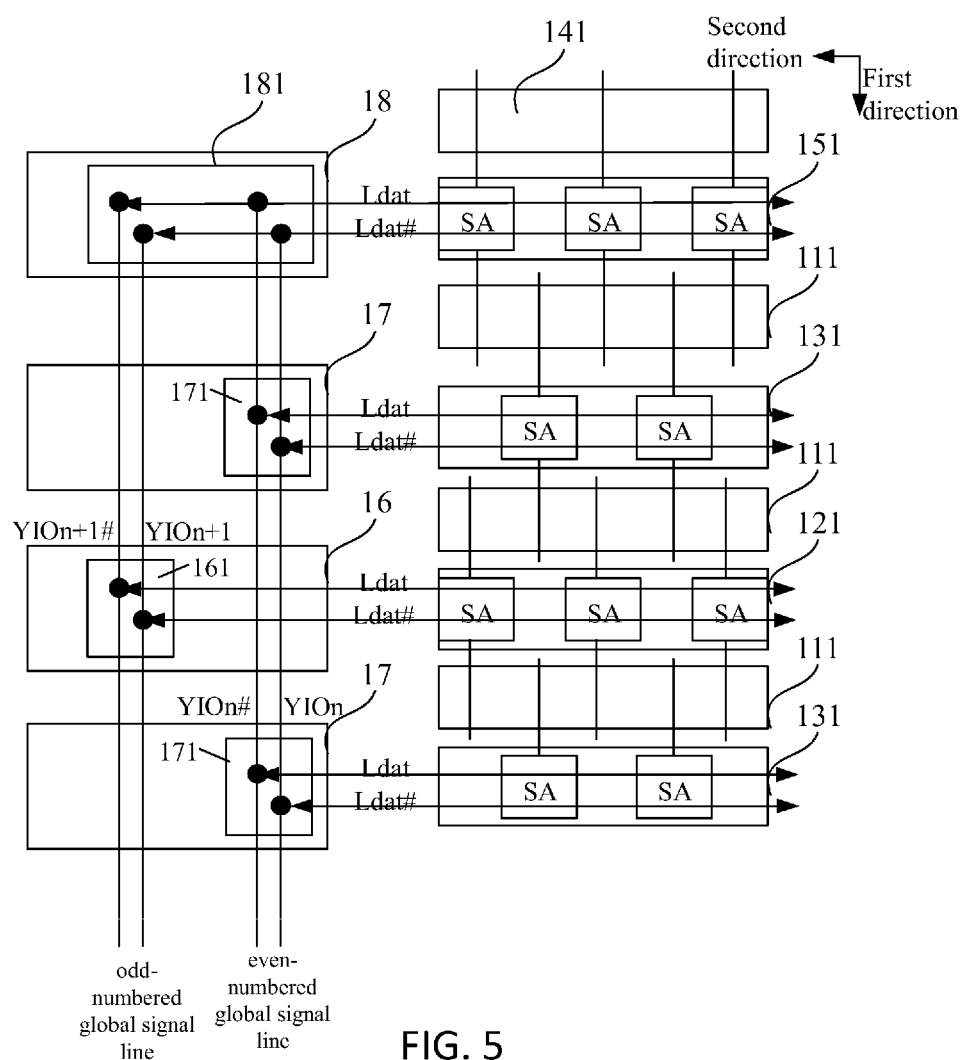
FIG. 5 illustrates the working principle of the spare read-write conversion circuitry in the embodiment of the present disclosure.

FIG. 5 is a schematic diagram of the working principle of the spare read-write conversion circuit in the embodiment of the present disclosure.

Referring to FIG. 5, a pair of local signal lines Ldat and complementary local signal lines Ldat # connected to the odd-numbered read-write conversion circuit 161 or the even-numbered read-write conversion circuit 171 are connected to an odd-numbered sensitivity amplifier sub-arrays 121 or an even-numbered sensitive amplifier sub-array 131. In the even-numbered sensitivity amplifier sub-arrays 131, each read-write conversion circuit is connected to a pair of local signal lines Ldat and complementary local signal lines Ldat # and a pair of YIO and YIO # signal lines. The odd-numbered read-write conversion circuit 161 is connected to the odd-numbered global signal line YIOn+1 and the complementary odd-numbered global signal line YIOn+1 #, and the even-numbered read-write conversion circuit 171 is connected to the even-numbered global signal line YIOn and the complementary even-numbered global signal line YIOn #. In some embodiments, each read-write conversion circuit may only be connected to the YIO signal line, that is, in some embodiments, the odd-numbered read-write conversion circuit 161 may also not be connected to the complementary odd-numbered global signal line YIOn+1 #. In principle, the even-numbered read-write conversion circuit 171 may also not be connected to the complementary even-numbered global signal line YIOn #, which is not specifically limited in the present disclosure.

A pair of signal lines of the spare read-write conversion circuit 181 are connected to a spare sensitivity amplifier sub-array 151. A plurality of spare read-write conversion circuits 181 corresponding to one first sensitivity amplifier array 15 constitute a spare read-write conversion array 18. The spare read-write conversion circuit 181 connects the odd-numbered global signal lines and the even-numbered global signal line at the same time, so that the spare memory array 14 can be controlled to flexibly replace the faulty memory array, or replace the memory array affected by the faulty sensitivity amplifier array.

Figure 6:
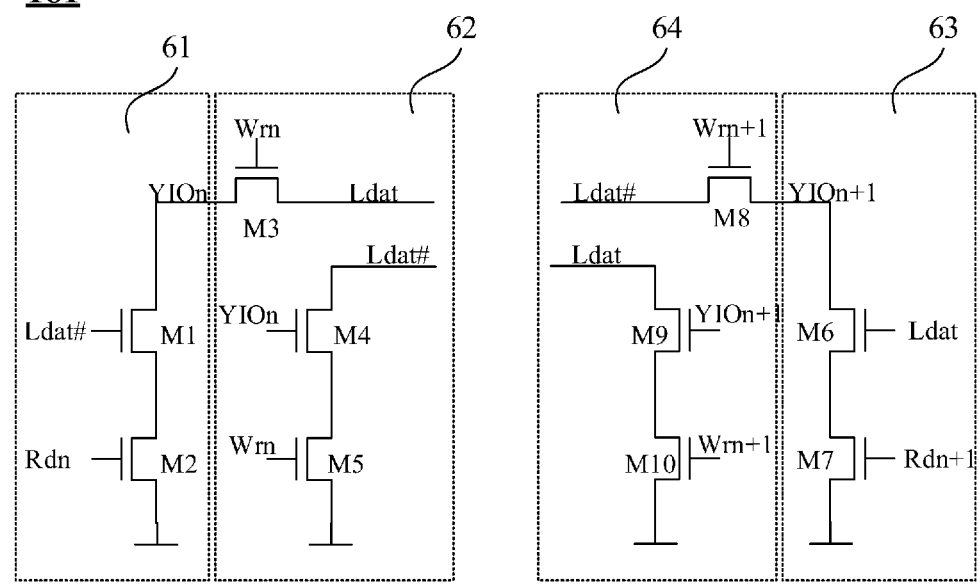
FIG. 6 is a schematic circuit diagram of the spare read-write conversion circuit 181 in the spare read-write conversion circuitry in the embodiment of the present disclosure.

FIG. 6 is a schematic circuit diagram of the spare read-write conversion circuit 181 in the spare read-write conversion circuitry in the embodiment of the present disclosure.

Referring to FIG. 6, the spare read-write conversion circuit 181 may include:
a even-numbered read control circuit 61 connected to the even-numbered global signal line YIOn, the even-numbered read control signal line Rdn and the complementary local signal line Ldat #;
The even-numbered write control circuit 62 is connected to the even-numbered global signal line YIOn, the even-numbered write control signal line Wrn, the complementary local signal line Ldat #, and the local sign line Ldat,
an odd-numbered read control circuit 63 connected to the odd-numbered global signal line YIOn+1, the odd-numbered read control signal line Rdn+1 and the local signal line Ldat; and
an odd-numbered write control circuit 64 connected to the odd-numbered global signal line YIOn+1, the odd-numbered write control signal line Wrn+1, the complementary local signal line Ldat #, and the local signal line Ldat.

In the embodiment shown in FIG. 6, the even-numbered read control circuit 61 includes a first N-type transistor M1 and a second N-type transistor M2, the drain of the first N-type transistor M1 is connected to the odd-numbered global signal line YIOn+1, and the gate is connected to the complementary local signal line Ldat #, the drain of the second N-type transistor M2 is connected to the source of the first N-type transistor M1, the gate of the second N-type transistor M2 is connected to the even-numbered read control signal line Rdn, and the source of the second N-type transistor M2 is grounded.

The even-numbered write control circuit 62 includes a third N-type transistor M3, a fourth N-type transistor M4, and a fifth N-type transistor M5. The first end of the third N-type transistor M3 is connected to the odd-numbered global signal line YIOn+1, and the second end is connected to the local signal line Ldat, the gate is connected to the even-numbered write control signal line Wrn, the drain of the fourth N-type transistor M4 is connected to the local signal line Ldat, the gate of the fourth N-type transistor M4 is connected to the odd-numbered global signal line YIOn+1, and the drain of the fifth N-type transistor M5 is connected to the source of the fourth N-type transistor M4, the gate of the fifth N-type transistor M5 is connected to the even-numbered write control signal line Wrn, and the source of the fifth N-type transistor M5 is grounded.

The odd-numbered read control circuit 63 includes: a sixth N-type transistor M6 and a seventh N-type transistor M7, the drain of the sixth N-type transistor M6 is connected to the even-numbered global signal line YIOn, the gate of the sixth N-type transistor M6 is connected to the local signal line Ldat, and the drain of the seventh N-type transistor M7 is connected to the source of the sixth N-type transistor M6, the gate is connected to the odd-numbered read control signal line Rdn+1, and the source is grounded.

The odd-numbered write control circuit 64 includes an eighth N-type transistor M8, a ninth N-type transistor M9, and a tenth N-type transistor M10. The first end of the eighth N-type transistor M8 is connected to the even-numbered global signal line YIOn, and the second end is connected to The complementary local signal line Ldat #, the gate is connected to the odd-numbered write control signal line Wrn+1, the drain of the ninth N-type transistor M9 is connected to the complementary local signal line Ldat #, the gate is connected to the even-numbered global signal line YIOn, the tenth N The drain of the type transistor M10 is connected to the source of the ninth N-type transistor M9, the gate is connected to the odd-numbered write control signal line Wrn+1, and the source is grounded.

When the circuit is in an even-numbered read state, after pre-charging the even-numbered global signal line YIOn (the pre-charging circuit of the signal line YIO is not shown), the even-numbered read control signal line Rdn enables the second N-type transistor M2 on, when the complementary local signal line Ldat # is at a high potential and the local signal line Ldat is at a low potential, the first N-type transistor M1 is turned on, and the local signal line Ldat is transmitted to the even-numbered voltage through the ground voltage connected by the second N-type transistor M2. In the bit global signal line YIOn, the voltage of the even-numbered global signal line YIOn becomes a low level, and at this time, the even-numbered global signal line YIOn reads out the data on the local signal line Ldat. When the complementary local signal line Ldat # is at a low level and the local signal line Ldat is at a high level, the first N-type transistor M1 is turned off, and the ground voltage connected to the second N-type transistor M2 cannot be transmitted to the even-numbered global signal line YIOn, the even-numbered global signal line YIOn maintains the high potential after pre-charging, and at this time, the even-numbered global signal line YIOn reads out the data on the local signal line Ldat. When the circuit is in the write state of the even bits, the even-numbered write control signal Wrn enables the third N-type transistor M3 and the fifth N-type transistor M5. At this time, if the even-numbered global signal line YIOn is at a high level, the fourth N-type transistor M3 and the fifth N-type transistor M5 are enabled by the even-numbered write control signal Wrn. The N-type transistor M4 is turned on, the complementary local signal line Ldat # becomes a low potential, and the local signal line Ldat maintains the pre-charged high potential. If the even-numbered global signal line YIOn is at a low potential, the fourth N-type transistor M4 is turned off, and the complementary local signal line is turned off. The signal line Ldat # becomes a high potential after precharging, and the local signal line Ldat becomes a low potential. The reading and writing principles of odd-numbered bits are the same, and are not repeated here. It can be seen from the above that after receiving different read-write control signals, the spare read-write conversion circuit can read and write even-numbered or odd-numbered bits, so as to write signals of odd-numbered or even-numbered bits according to different read-write control signals. The spare memory array or read from the spare memory array.

Figure 7:
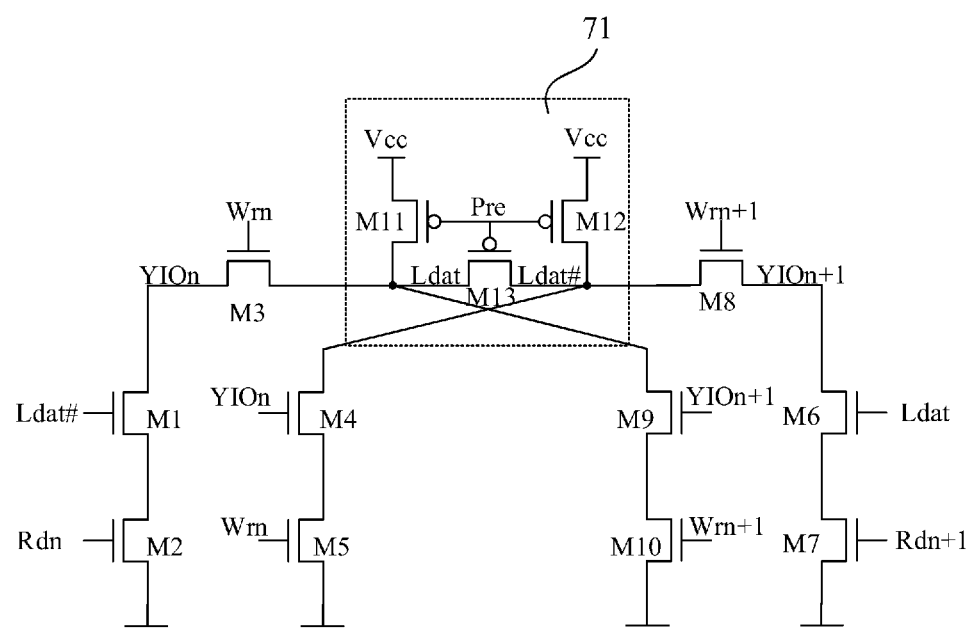
FIG. 7 is a schematic diagram of the spare read-write conversion circuit 181 in another embodiment of the present disclosure.

FIG. 7 is a schematic diagram of the spare read-write conversion circuit 181 in another embodiment of the present disclosure.

Referring to FIG. 7, in an exemplary embodiment of the present disclosure, the spare read-write conversion circuit 181 may further include a precharge circuit 71. The precharge circuit 71 is connected to the complementary local signal line Ldat #, the local signal line Ldat, the power supply voltage Vcc and the precharge signal Pre, and the precharge circuit 71 is used to pull up the complementary local signal line Ldat # and the local signal line Ldat, and to the complementary local signal line Ldat # and the local signal line Ldat are precharged.

In the embodiment shown in FIG. 7, the precharge circuit 71 may include:
  a first P-type transistor M11, the source of M11 is connected to the power supply voltage Vcc, the gate is connected to the precharge control signal Pre, and the drain is connected to the local signal line Ldat;
  a second P-type transistor M12, the source of M11 is connected to the power supply voltage Vcc, the gate is connected to the precharge control signal Pre, and the drain is connected to the complementary local signal line Ldat #; and
  a third P-type transistor M13 which has a first end connected to the complementary local signal line Ldat #, a second end connected to the local signal line Ldat, and a control end connected to the precharge control signal Pre.

In the embodiment of the present disclosure, the precharge circuit 71 is provided, and before writing, the first P-type transistor M11 and the second P-type transistor M12 are enabled by outputting the precharge control signal Pre, so as to provide a signal to the complementary local signal line Ldat # Precharge with local signal line Ldat.

By pulling up the complementary local signal line Ldat # and the local signal line Ldat, the threshold loss of signal transmission can also be avoided, so that the effect of signal transmission is better.

Figure 8:
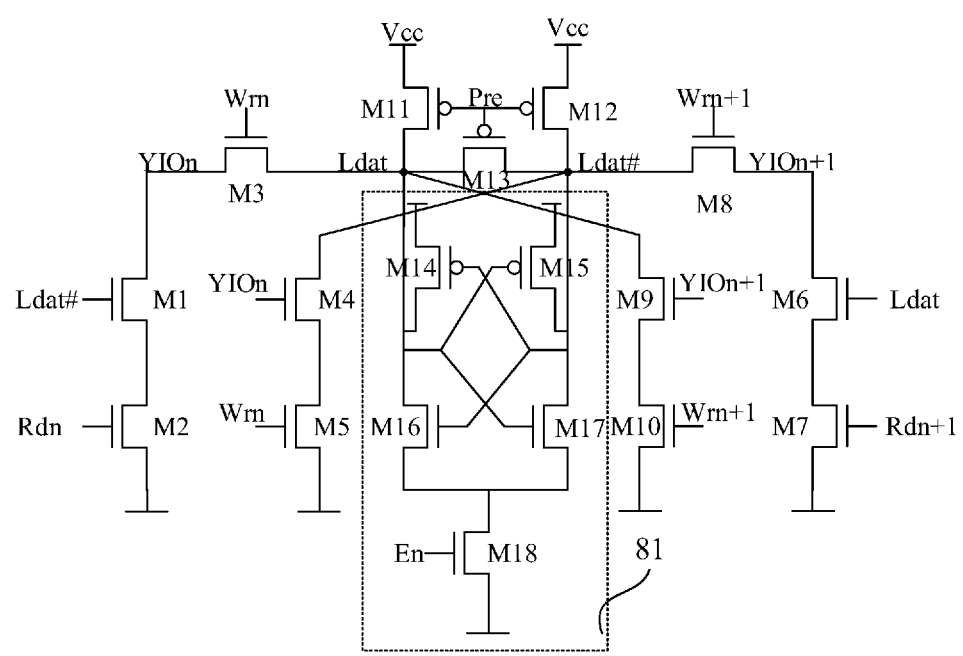
FIG. 8 is a schematic diagram of the spare read-write conversion circuit 181 in still another embodiment of the present disclosure.

FIG. 8 is a schematic diagram of the spare read-write conversion circuit 181 in still another embodiment of the present disclosure.

Referring to FIG. 8, in an exemplary embodiment of the present disclosure, the spare read-write conversion circuit 181 further includes a read-write auxiliary circuit 81, which is connected to the complementary local signal line Ldat #, the local signal line Ldat and the enable signal, the read/ write auxiliary circuit 81 is used to amplify the complementary local signal line Ldat # and the local signal line Ldat.

In the embodiment shown in FIG. 8, the read/write auxiliary circuit 81 includes:
  a fourth P-type transistor M14, the source is connected to the power supply voltage;
  a fifth P-type transistor M15, the source is connected to the power supply voltage, the gate is connected to the source M14 of the fourth P-type transistor, and the source is connected to the gate of the fourth P-type transistor M14;
  an eleventh N-type transistor M16, the drain is connected to the source of the fourth P-type transistor M14, and the gate is connected to the source of the fifth P-type transistor M15;
  a twelfth N-type transistor M17, the drain is connected to the source of the fifth P-type transistor M15, the gate is connected to the source of the fourth P-type transistor M14, and the source is connected to the source of the eleventh N-type transistor M16; and
  a thirteenth N-type transistor M18, the drain is connected to the source of the eleventh N-type transistor M16, the gate is connected to the enable signal En, and the source is grounded.

The read/write auxiliary circuit 81 can amplify the complementary local signal line Ldat # and the local signal line Ldat when the enable signal En is in the enable state, so that the signal transmission effect is better.

When the memory array fails, the spare memory array 14 and the first sensitivity amplifier array 15 are automatically used to replace the failed memory array, and when the sensitivity amplifier array fails, the spare memory array 14 and the first sensitivity amplifier array 15 are automatically used to replace the failed sensitive amplifier. The two memory arrays affected by the amplifier can not only effectively improve the reliability of memory products, but also improve the test success rate and yield rate of memory products, thereby reducing production costs.

Figure 9:
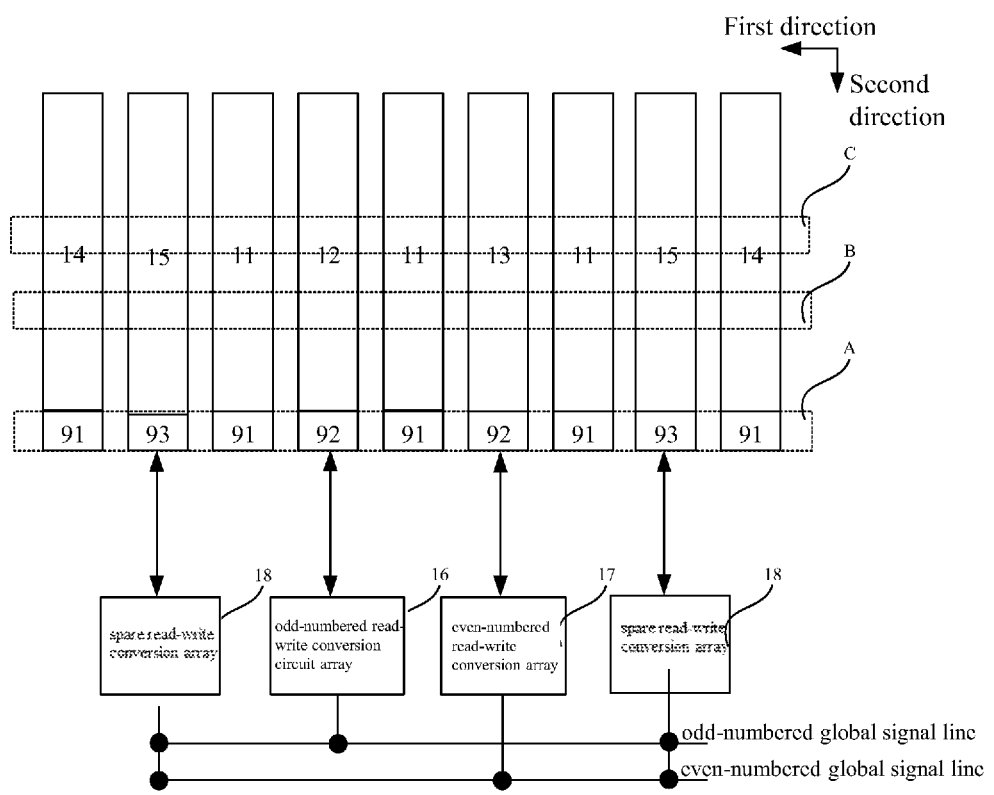
FIG. 9 is a schematic diagram of a memory structure in another embodiment of the present disclosure.

FIG. 9 is a schematic diagram of a memory structure in another embodiment of the present disclosure.

Referring to FIG. 9, in an embodiment of the present disclosure, a second spare memory sub-array 91 is further arranged in the memory array 11, and a spare sensitivity amplifier sub-array is arranged between the second spare memory sub-arrays 91 of the adjacent memory arrays 11. The spare sensitivity amplifier sub-arrays 92 located in different odd-numbered sensitivity amplifier arrays 12 are all electrically connected to the same spare odd-numbered global signal line, and the spare sensitivity amplifier sub-arrays 92 located in different even-numbered sensitivity amplifier arrays 13 are all electrically connected to the same spare even-numbered global signal line.

Meanwhile, the spare memory array 14 also includes a second spare memory sub-array 91, the second spare memory sub-array 91 is provided with a corresponding spare first sensitivity amplifier sub-array 93 located in the first sensitivity amplifier array 15, and the spare first sensitivity amplifier sub-array 93 is simultaneously connected to the spare odd-numbered global signal lines and the spare even-numbered global signal line through the spare read-write conversion array 18.

In the embodiment shown in FIG. 9, the number of second spare memory sub-arrays 91 in both the memory array 11 and the spare memory array 14 is one. In other embodiments, more second spare sub-arrays may be set in each memory array. The sub-array 91 is stored. In addition, the second spare memory sub-arrays 91 may be located at various positions in the memory arrays, and each second spare memory sub-array 91 has the same position in the respective memory arrays. In an exemplary embodiment of the present disclosure, the second spare memory sub-array 91 is located in the middle of the memory array 11 or the spare memory array 14. Those skilled in the art can set the quantity and location of the second spare memory sub-arrays 91 according to actual conditions, which is not particularly limited in the present disclosure.

Referring to FIG. 9, when a large failure occurs in a key position related to a column, a column of memory sub-array B (also called a column block area) where the faulty memory sub-array is located can be disabled first, and each memory array can be used for a second spare memory sub-array A in a row to repair the replacement. At this time, if the spare memory array 14 is enabled, the second spare memory sub-array A in this row includes the second spare memory sub-array 91 in each memory array 11 and the second spare memory sub-array 91 in the spare memory array 14; If the spare memory array 14 is not enabled, the second spare memory sub-array aof the column includes only the second spare memory sub-array 91 in each memory array 11.

In the peripheral circuit, when data needs to be written to a row of memory sub-arrays B including the faulty memory sub-arrays, a row of second spare memory sub-arrays A in all memory arrays 11 can be read and written to replace the faulty memory sub-arrays. The column where it is located stores sub-array B. When reading, it is necessary to control to output the YIO data read out from a column of the second spare memory sub-array A to a position corresponding to the replaced column of memory sub-arrays.

The replacement function of column A to column B can perform the entire replacement of column A to column B, or a partial replacement. For example, when accessing one memory array, use the second spare memory sub-array in column A to replace the failed memory sub-array in column B; when accessing another memory array, use the second spare memory sub-array in column A to replace failed memory sub-array in column C.

Figure 10:
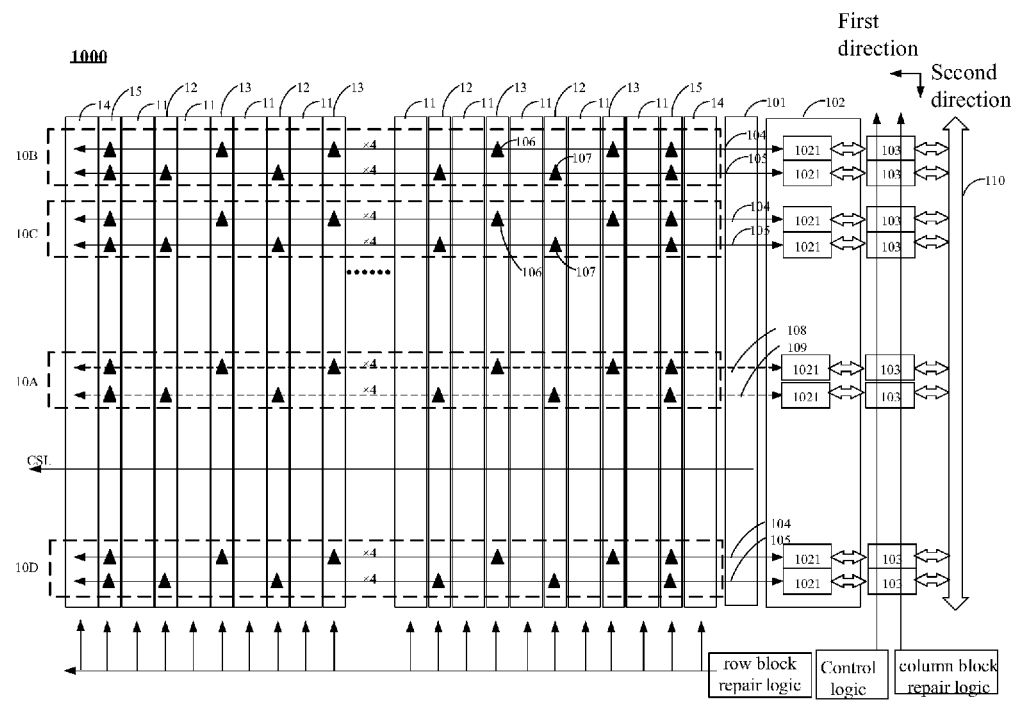
FIG. 10 is a schematic diagram of a memory circuit having a redundancy replacement function in an embodiment of the present disclosure.

FIG. 10 is a schematic diagram of a memory circuit having a redundancy replacement function in an embodiment of the present disclosure.

Referring to FIG. 10, in the memory circuit 1000, an odd-numbered sensitivity amplifier array 12 and an even-numbered sensitivity amplifier array 13 are arranged between the memory arrays 11. A spare memory array 14 and a first sensitivity amplifier array 15 are arranged beside the memory array 11 located at the edge. In addition, the memory circuit 1000 further includes a column decoding circuit (YDEC) 101, a sensitivity amplifier data write driver circuit (YIO SA & write driver) 102, a plurality of data selectors (MUX, multiplexer) 103, a sensitivity amplifier data write driver 102 includes a plurality of sensitivity amplifier data writing circuits 1021.

Each sensitivity amplifier data writing circuit 1021 is connected to an odd-numbered global signal line 104 or an even-numbered signal line 105 and is connected to a data selector 103. The other end of the data selector 103 is connected to the data bus 110, and is controlled by the control logic and the column block repair logic. The data writing circuit 1021 of the sensitivity amplifier writes to the odd-numbered global signal line 104 or even-numbered global signal line 105.

The memory circuit 1000 is divided into a plurality of column blocks in the second direction, each block includes a memory sub-array and a sensitivity amplifier sub-array located in the same column, for example, the column blocks 10B, 10C, 10D, all column blocks connected to four odd-numbered global signal lines 104 and four even-numbered global signal line 105, that is, 8-bit data can be transmitted. Specifically, an odd-numbered sensitivity amplifier sub-array is connected to four odd-numbered global signal lines through four read-write conversion circuits, and an even-numbered sensitivity amplifier sub-array is connected to four even-numbered global signal line through four read-write conversion circuits. The number of odd-numbered global signal lines 104 and even-numbered global signal line 105 connected in each column block area may vary according to the memory capacity or memory processing capability of the memory array, and the present disclosure is not limited thereto.

The odd-numbered global signal line 104 is electrically connected to the odd-numbered sensitivity amplifier array 12 through the odd-numbered connection point 106 (specifically, the odd-numbered global signal line 104 is connected to the odd numbered sensitivity amplifier sub-arrays 121 shown in FIG. 3 through the odd numbered read-write conversion circuit), the even-numbered global signal line 105 is electrically connected to the even-numbered sensitivity amplifier array 13 through the even-numbered connection point 107 (specifically, the even-numbered global signal line 105 is connected to the even-numbered sensitivity amplifier sub-array shown in FIG. 3 through the even-numbered read-write conversion circuit 17 connection). In addition, the odd-numbered global signal lines 104 and the even-numbered global signal lines 105 are electrically connected to the first sensitivity amplifier array 15 through the odd-numbered connection points 106 and the even-numbered connection points 107. For connection methods, refer to the circuits shown in FIGS. 6 to 8. The present disclosure will not be repeated here.

The spare column block area A includes a plurality of second spare memory sub-arrays and spare sensitivity amplifier sub-arrays located in the same column. In some embodiments, when the spare memory array and the first sensitivity amplifier array are enabled, the spare column block area 10A included are a first spare memory sub-array in the spare memory array and a spare first sensitivity amplifier sub-array in the first sensitivity amplifier array. The spare sensitivity amplifier sub-arrays located in the odd-numbered sensitivity amplifier array 12 are all electrically connected to the same four spare odd-numbered global signal lines 108, and the spare sensitivity amplifier sub-arrays located in the even-numbered sensitivity amplifier array 13 are electrically connected to the same four. The spare even-numbered global signal line 109 and the spare first sensitivity amplifier sub-array are electrically connected to the four spare odd-numbered global signal lines 108 and the four spare even-numbered global signal line 109 at the same time. The spare column block area 10A is connected to four spare odd-numbered global signal lines 108 and four even-numbered global signal line 109 in total, that is, 8 bits of data can be transmitted. The number of odd-numbered global signal lines 108 and even-numbered global signal line 109 connected in the spare column block area 10A may vary according to the memory capacity or memory processing capability of the memory array, which is the same as the column block areas 10B, 10C, and 10D. It can be known that, in some embodiments, the number of rank blocks may be 16 (excluding the spare rank block A). The connection mode of the spare odd-numbered global signal line 108 or spare even-numbered global signal line 109 and the spare sensitivity amplifier sub-array (the position where the dotted line box intersects the odd-numbered sensitivity amplifier array 12 or the even-numbered sensitivity amplifier array 13 in FIG. 10 is the same as the other odd-numbered global signal lines or even-numbered global signal line corresponding to the sensitivity amplifier array where the spare sensitivity amplifier sub-array is located are the same, and details are not described herein again.

The relative positions and numbers of the spare column block areas 10A are only examples. In other embodiments of the present disclosure, the spare column block areas 10A may also be located at other positions, and the number may also be equal to or more than two.

When any one of the column block regions 10B, 10C, 10D is damaged (e.g., the number of inoperable memory sub-arrays and/or sensitivity amplifier sub-arrays exceeds a preset threshold), the spare column block region 10A can be used for the damaged column in the block area 10B, 10C, or 10D is replaced by the entire column. During specific execution, the data selector 103 is set by the column block area replacement logic, so that the data corresponding to the damaged column block area 10B, 10C or 10D is transmitted to the spare column block area 10A, and then the data selector 103 is changed by the control logic to perform data output control. The column block area or the spare column block area can be enabled through a column select signal (CSL, column select) corresponding to each column.

Similarly, when any one of the memory array 11, the odd-numbered sensitivity amplifier 12, and the even-numbered sensitivity amplifier 13 is damaged, the spare memory array 14 and the first sensitivity amplifier array 15 can be used for replacement, thereby realizing the replacement in the row direction. In one embodiment, row block repair logic can be used to control the enabling of the memory array 11, the odd-numbered sensitivity amplifier 12, the even-numbered sensitivity amplifier 13, the spare memory array 14, and the first sensitivity amplifier array 15, or disabled so that the data is transferred correctly to the memory array or to a spare memory array.

Through the memory structure provided by the embodiments of the present disclosure, whether it is a large-area manufacturing error related to a column or a row, it can be repaired by replacing the entire block together, thereby improving the repair capability and chip reliability. Yield rate, success rate, especially for the early research and development of new processes is more effective.

According to a second aspect of the present disclosure, there is provided a memory including the memory structure of any preceding item.

It should be noted that although several modules or units of the apparatus for action performance are mentioned in the above detailed description, this division is not mandatory. Indeed, according to embodiments of the present disclosure, the features and functions of two or more modules or units described above may be embodied in one module or unit. Conversely, the features and functions of one module or unit described above may be further divided into multiple modules or units to be embodied.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the claims.

INDUSTRIAL APPLICABILITY

In the embodiment of the present disclosure, by arranging a spare memory array and a first sensitivity amplifier array beside the memory array, and simultaneously connecting the first sensitivity amplifier array to the odd-numbered global signal lines and the even-numbered global signal line, when damage of the memory array or the sensitivity amplifier array occurs, the first sensitivity amplifier array and the spare memory array are automatically used for replacement, thereby improving the reliability of the memory product and the success rate of the factory test, improving the yield of the product, and reducing the production cost and use cost of the memory product.

The invention claimed is:

1. A memory structure, comprising:
a plurality of memory arrays arranged in parallel along a first direction and extending along a second direction, wherein a sensitivity amplifier array extending along the second direction is arranged between every two of the plurality of memory arrays, wherein the sensitivity amplifier array comprises an odd-numbered sensitivity amplifier array and an even-numbered sensitivity amplifier array, wherein the odd-numbered sensitivity amplifier array and the even-numbered sensitivity amplifier array are alternating along a first direction, and wherein the odd-numbered sensitivity amplifier array is connected to a plurality of odd-numbered global signal lines, and the even-numbered sensitivity amplifier array is connected to a plurality of even-numbered global signal lines;
and
at least one spare memory array, arranged on at least one side of the plurality of memory arrays in the first direction, wherein a first sensitivity amplifier array is arranged between a spare memory array and a memory array at the edge, and wherein the first sensitivity amplifier array is connected to the odd-numbered memory array; and, wherein
wherein both the plurality of odd-numbered global signal lines and the plurality of even-numbered global signal lines are connected.

2. The memory structure of claim 1, wherein each of the plurality of memory arrays comprises a plurality of memory sub-arrays arranged along the second direction, and wherein the sensitivity amplifier array comprises a plurality of sensitivity amplifier sub-arrays, wherein each of the plurality of the sensitivity amplifier sub-arrays is connected to one of read-write conversion circuits, wherein the plurality of the sensitivity amplifier sub-arrays is in one-to-one correspondence with the plurality of memory sub-arrays, wherein the odd-numbered sensitivity amplifier array passes through the read-write conversion circuits and electrically connects to the plurality of odd-numbered global signal lines, and wherein the even-numbered sensitivity amplifier array is electrically connected to the plurality of even-numbered global signal lines; and
wherein each of the spare memory array comprises a plurality of first spare memory sub-arrays, wherein the first sensitivity amplifier array comprises a plurality of first sensitivity amplifier sub-arrays, and wherein each of the plurality of first spare memory sub-arrays corresponds to one of the plurality of first sensitivity amplifiers, wherein the first sensitivity amplifier sub-array is electrically connected to both the plurality of odd-numbered global signal lines and the plurality of even-numbered global signal lines through a spare read-write conversion circuit.

3. The memory structure of claim 1, wherein a number of the spare memory array is two, which are respectively disposed beside two of the plurality of memory arrays located at the edge.

4. The memory structure of any one of claims 1-3, wherein each of the plurality of memory arrays and each of the spare memory array comprises a second spare memory sub-array, wherein the second spare memory sub-array is arranged to be along the first direction; and
wherein the sensitivity amplifier array further comprises a spare sensitivity amplifier sub-array, and wherein the spare sensitivity amplifier sub-array is located between two adjacent second spare memory sub-arrays.

5. The memory structure of claim 4, wherein a number of the second spare memory sub-arrays in each of the plurality of memory arrays or the spare memory arrays is one.

6. The memory structure of claim 4, wherein the spare sensitivity amplifier sub-arrays located in the odd-numbered sensitivity amplifier array is electrically connected to a same spare odd-numbered global signal line; and wherein the spare sensitivity amplifier sub-arrays located in the even-numbered sensitivity amplifier array is electrically connected to a same spare even-numbered global signal line.

7. The memory structure of claim 2, wherein the spare read-write conversion circuit comprises:
an even-numbered read control circuit, connected to the plurality of even-numbered global signal lines, an even-numbered read control signal line and a complementary local signal line;
an even-numbered write control circuit, connected to the plurality of even-numbered global signal lines, an even-numbered write control signal line, a complementary local signal line and a local signal line;
an odd-numbered read control circuit, connected to the plurality of odd-numbered global signal lines, an odd-numbered read control signal line, and the local signal line; and
an odd-numbered write control circuit, connected to the plurality of odd-numbered global signal lines, an odd-numbered write control signal line, the complementary local signal line, and the local signal line.

8. The memory structure of claim 7, wherein the spare read-write conversion circuit further comprises:
a precharge circuit, wherein the precharge circuit is connected to the complementary local signal line, the local signal line, a power supply voltage, and a precharge signal, and wherein the precharge circuit pulls up the complementary local signal line and the local signal line.

9. The memory structure of claim 7, wherein the spare read-write conversion circuit further comprises:
a read-write auxiliary circuit, wherein the read-write auxiliary circuit is connected to the complementary local signal line, the local signal line, and an enable signal, and wherein the read-write auxiliary circuit amplifies the complementary local signal line and the local signal line.

10. The memory structure of claim 7, wherein the even-numbered read control circuit comprises a first N-type transistor and a second N-type transistor, wherein a drain of the first N-type transistor is connected to the plurality of odd-numbered global signal lines, a gate of the first N-type transistor is connected to the complementary local signal line, a drain of the second N-type transistor is connected to a source of the first N-type transistor, a gate of the second N-type transistor is connected to the even-numbered read control signal line, and a source of the second N-type transistor is grounded;
wherein the even-numbered write control circuit comprises a third N-type transistor, a fourth N-type transistor, and a fifth N-type transistor,
wherein a first end of the third N-type transistor is connected to the plurality of odd-numbered global signal lines, and a second end of the third N-type transistor is connected to the local signal line, a gate of the third N-type transistor is connected to the even-numbered write control signal line,
wherein a drain of the fourth N-type transistor is connected to the local signal line, a gate of the fourth N-type transistor is connected to the plurality of odd-numbered global signal lines, and
wherein a drain of the fifth N-type transistors is connected to a source of the fourth N-type transistor, a gate of the fifth N-type transistors is connected to the even-numbered write control signal line, and a source of the fifth N-type transistors is grounded.

11. The memory structure of claim 7, wherein the odd-numbered read control circuit comprises:
a sixth N-type transistor and a seventh N-type transistor, wherein a drain of the sixth N-type transistor is connected to the plurality of even-numbered global signal lines, a gate of the sixth N-type transistor is connected to the local signal line, and
wherein a drain of the seventh N-type transistor is connected to a source of the sixth N-type transistor, a gate of the seventh N-type transistor is connected to the odd-numbered read control signal line, and a source of the seventh N-type transistor is grounded;
wherein the odd-numbered write control circuit further comprises an eighth N-type transistor, a ninth N-type transistor and a tenth N-type transistor, wherein a first end of the eighth N-type transistor is connected to the plurality of even-numbered global signal lines, a second end of the eighth N-type transistor is connected to the complementary local signal line, and a gate of the eighth N-type transistor is connected to the odd-numbered write control signal line, wherein a drain of the ninth N-type transistor is connected to the complementary local signal line, a gate of the ninth N-type transistor is connected to the plurality of even-numbered global signal lines, and
wherein a drain of the tenth N-type transistor is connected to a source of the ninth N-type transistor, a gate of the tenth N-type transistor is connected to the odd-numbered write control signal line, and a source of the tenth N-type transistor is grounded.

12. The memory structure of claim 8, wherein the precharge circuit comprises:
a first P-type transistor, wherein a source of the first P-type transistor is connected to a power supply voltage, a gate of the first P-type transistor is connected to a precharge control signal, and a drain of the first P-type transistor is connected to the local signal line;
a second P-type transistor, wherein a source of the second P-type transistor is connected to the power supply voltage, a gate of the second P-type transistor is connected to the precharge control signal, and a drain of the second P-type transistor is connected to the complementary local signal line; and a third P-type transistor, wherein a first end of the third P-type transistor connected to the complementary local signal line, a second end of the third P-type transistor is connected to the local signal line, and a control end of the third P-type transistor is connected to the precharge control signal.

13. The memory structure of claim 9, wherein the read-write auxiliary circuit comprises:
   a fourth P-type transistor, wherein a source of the fourth P-type transistor is connected to a power supply voltage;
   a fifth P-type transistor, wherein a source of the fifth P-type transistor is connected to the power supply voltage, a gate of the fifth P-type transistor is connected to a source of the fourth P-type transistor, and a source of the fifth P-type transistor is connected to a gate of the fourth P-type transistor;
   an eleventh N-type transistor, wherein a drain of the eleventh N-type transistor is connected to the source of the fourth P-type transistor, and a gate of the eleventh N-type transistor is connected to the source of the fifth P-type transistor;
   a twelfth N-type transistor, wherein a drain of the twelfth N-type transistor is connected to a source of the fifth P-type transistor, a gate of the twelfth N-type transistor is connected to a source of the fourth P-type transistor, and a source of the twelfth N-type transistor is connected to a source of the eleventh N-type transistor; and
   a thirteenth N-type transistor, wherein a drain of the thirteenth N-type transistor is connected to a source of the eleventh N-type transistor, a gate of the thirteenth N-type transistor is connected to the enable signal, and a source of the thirteenth N-type transistor is grounded.

14. A memory, comprising the memory structure of any one of claim 1.

* * * * *